US012426167B2

(12) United States Patent
Kim et al.

(10) Patent No.: US 12,426,167 B2
(45) Date of Patent: Sep. 23, 2025

(54) PRINTED CIRCUIT BOARD AND MANUFACTURING METHOD FOR THE SAME

(71) Applicant: SAMSUNG ELECTRO-MECHANICS CO., LTD., Suwon-si (KR)

(72) Inventors: Soo Yun Kim, Suwon-si (KR); Jung Soo Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 267 days.

(21) Appl. No.: 18/093,584

(22) Filed: Jan. 5, 2023

(65) Prior Publication Data
US 2024/0057267 A1    Feb. 15, 2024

(30) Foreign Application Priority Data
Aug. 10, 2022    (KR) .................... 10-2022-0099855

(51) Int. Cl.
*H05K 3/40*    (2006.01)
*H05K 1/11*    (2006.01)
*H05K 3/46*    (2006.01)

(52) U.S. Cl.
CPC .......... *H05K 3/4038* (2013.01); *H05K 1/115* (2013.01); *H05K 3/46* (2013.01); *H05K 2201/095* (2013.01)

(58) Field of Classification Search
None
See application file for complete search history.

(56) References Cited

U.S. PATENT DOCUMENTS

| | | | |
|---|---|---|---|
| 10,827,615 B1 * | 11/2020 | Choi | H05K 1/0271 |
| 11,229,117 B1 | 1/2022 | Kim et al. | |
| 2006/0009026 A1 * | 1/2006 | Sawaguchi | H05K 3/465 |
| | | | 438/622 |
| 2006/0145328 A1 * | 7/2006 | Hsu | H05K 1/185 |
| | | | 257/690 |
| 2009/0310323 A1 * | 12/2009 | Baek | H01L 23/5389 |
| | | | 29/829 |
| 2011/0164391 A1 * | 7/2011 | Shin | H01L 23/13 |
| | | | 216/13 |
| 2016/0330836 A1 * | 11/2016 | Mizutani | H05K 3/423 |
| 2020/0253062 A1 * | 8/2020 | Zhang | H05K 1/186 |

FOREIGN PATENT DOCUMENTS

| | | | | |
|---|---|---|---|---|
| EP | 2592915 B1 * | 1/2022 | | H01L 24/19 |
| JP | 2001-015920 A | 1/2001 | | |
| KR | 10-2022-0059740 A | 5/2022 | | |

* cited by examiner

*Primary Examiner* — Timothy J Thompson
*Assistant Examiner* — John B Freal
(74) *Attorney, Agent, or Firm* — MORGAN, LEWIS & BOCKIUS LLP

(57) ABSTRACT

Disclosed is a printed circuit board and a manufacturing method for manufacturing the same, the printed circuit board including: a first insulating layer; a through-hole penetrating through the first insulating layer; a via conductor layer disposed in the through-hole, and having first and second groove portions recessed inwardly of the through-hole from an upper surface and a lower surface of the first insulating layer, respectively; a cavity penetrating through at least a portion of the first insulating layer; an electronic component disposed in the cavity; and a second insulating layer covering at least a portion of the first insulating layer, and disposed in at least a portion of each of the through-hole and the cavity.

21 Claims, 5 Drawing Sheets

PRINTED CIRCUIT BOARD AND MANUFACTURING METHOD FOR THE SAME

CROSS-REFERENCE TO RELATED APPLICATION(S)

This application claims benefit of priority to Korean Patent Application No. 10-2022-0099855 filed on Aug. 10, 2022 in the Korean Intellectual Property Office, the disclosure of which is incorporated herein by reference in its entirety.

TECHNICAL FIELD

The present disclosure relates to a printed circuit board and a manufacturing method for the same BACKGROUND In order to process exponentially increased data due to the recent development of artificial intelligence technology, a multi-chip package including memory chips such as High Bandwidth Memory (HBM) chips, or the like, processor chips such as Central Processing Unit (CPU), Graphics Processing Unit (GPU), Application Specific Integrated (ASCI), or the like, is being developed. For example, a package technology in which an electronic component such as a semiconductor chip, or the like, is embedded in a package substrate in which a cavity is formed and an interconnection length is shortened to improve circuit processing speed, is being actively developed. In general, such a package substrate provides an electrical connection path by forming a plated through-hole (PTH), or the like in a core layer.

SUMMARY

An aspect of the present disclosure is to provide a printed circuit board capable of shortening a lead time of manufacturing a substrate and a manufacturing method for the same.

Another aspect of the present disclosure is to provide a printed circuit board that can easily fill an inside of a through-hole even when a thickness of a core layer is relatively thick, and a manufacturing method for the same.

One of the various solutions proposed through the present disclosure is to form a bridge plating layer in a through-hole using a pulse plating method, and then stack a build-up insulating layer to substantially simultaneously perform a filling process of the through-hole and embedding process of an electronic component.

According to an aspect of the present disclosure, a printed circuit board may include: a first insulating layer; a through-hole penetrating through the first insulating layer; a via conductor layer disposed in the through-hole, and having first and second groove portions recessed inwardly of the through-hole from an upper surface and a lower surface of the first insulating layer, respectively; a cavity penetrating through at least a portion of the first insulating layer; an electronic component disposed in the cavity; and a second insulating layer covering at least a portion of the first insulating layer, and disposed in at least a portion of each of the through-hole and the cavity.

According to an aspect of the present disclosure, a manufacturing method for a printed circuit board, may include: an operation of forming a through-hole in a first insulating layer; an operation of forming a via conductor layer having first and second groove portions recessed inwardly of the through-hole from an upper surface and a lower surface of the first insulating layer, respectively, in the through-hole; an operation of forming a cavity in the first insulating layer; an operation of disposing an electronic component in the cavity; and an operation of stacking a second insulating layer on the first insulating layer, and filling at least a portion of each of the through-hole and the cavity with the second insulating layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
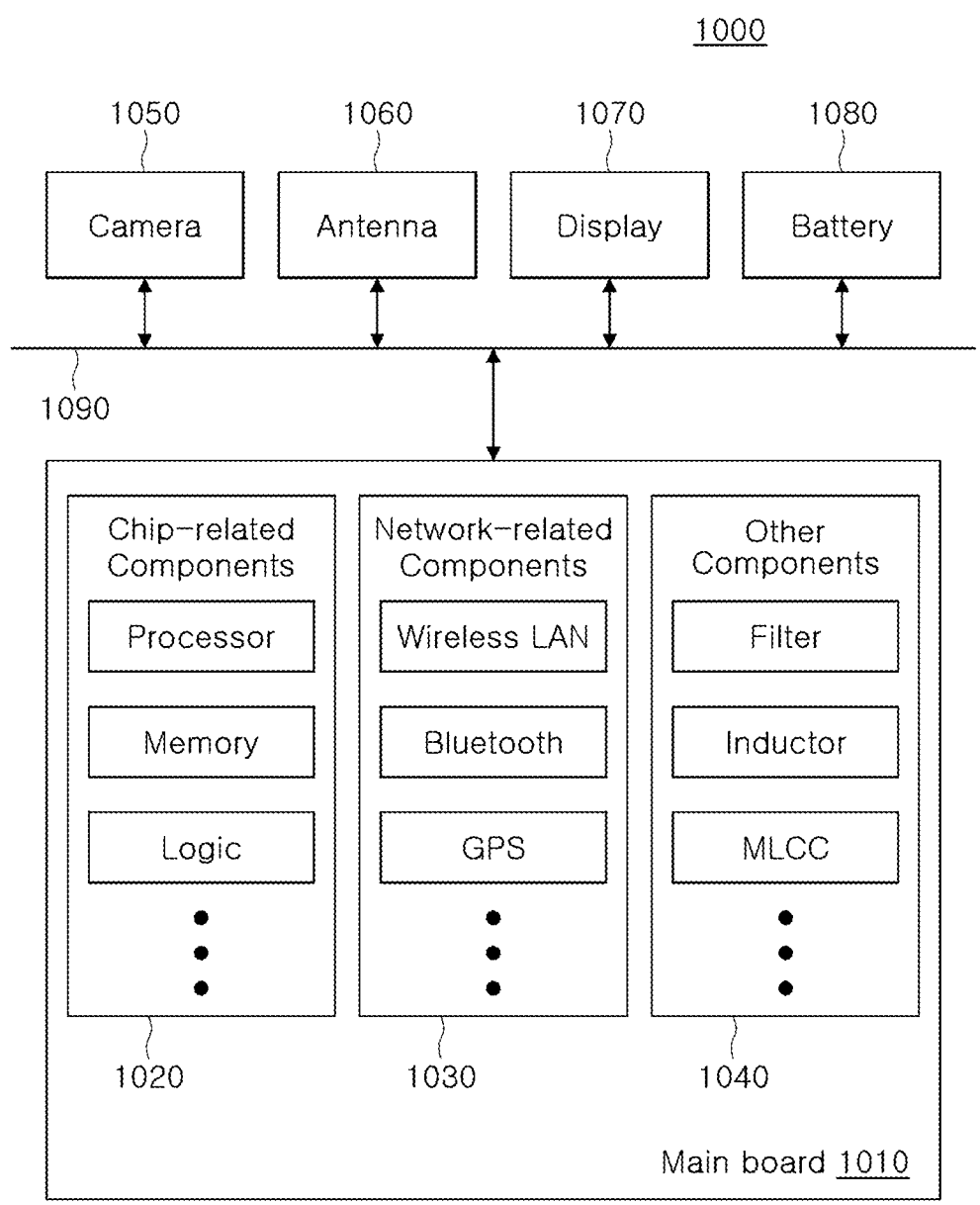
FIG. 1 is a block diagram schematically illustrating an example of an electronic device system.

Hereinafter, exemplary embodiments of the present disclosure will be described in detail with reference to the accompanying drawings. Further, these embodiments are provided so that this disclosure will be thorough and complete, and will fully convey the scope of the disclosure to those skilled in the art. It should be understood that the various embodiments of the present disclosure are different, but need not be mutually exclusive. For example, certain features, structures, and characteristics described herein may be implemented in other exemplary embodiments without departing from the spirit and the scope of the present disclosure in connection with an exemplary embodiment. In addition, it is also to be understood that the position or disposition of individual components within each disclosed exemplary embodiment may be varied without departing from the spirit and the scope of the present disclosure. Therefore, the following detailed description is not to be taken in a limited meaning, and the scope of the present disclosure is to be limited only by the appended claims, along with the full scope of equivalents to which the claims are entitled, if properly explained. In the drawings, like reference numerals refer to the same or similar functions throughout the several aspects. Hereinafter, exemplary embodiments of the present disclosure will be described in detail with reference to the accompanying drawings so that those skilled in the art may easily carry out the present disclosure.

Electronic Device

FIG. 1 is a block diagram schematically illustrating an example of an electronic device system.

Referring to FIG. 1, an electronic device 1000 may accommodate a main board 1010. The main board 1010 may include chip-related components 1020, network-related components 1030, other components 1040, or the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip-related components 1020 are not limited thereto, and may include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 includes other components that may or may not be physically or electrically connected to the main board 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
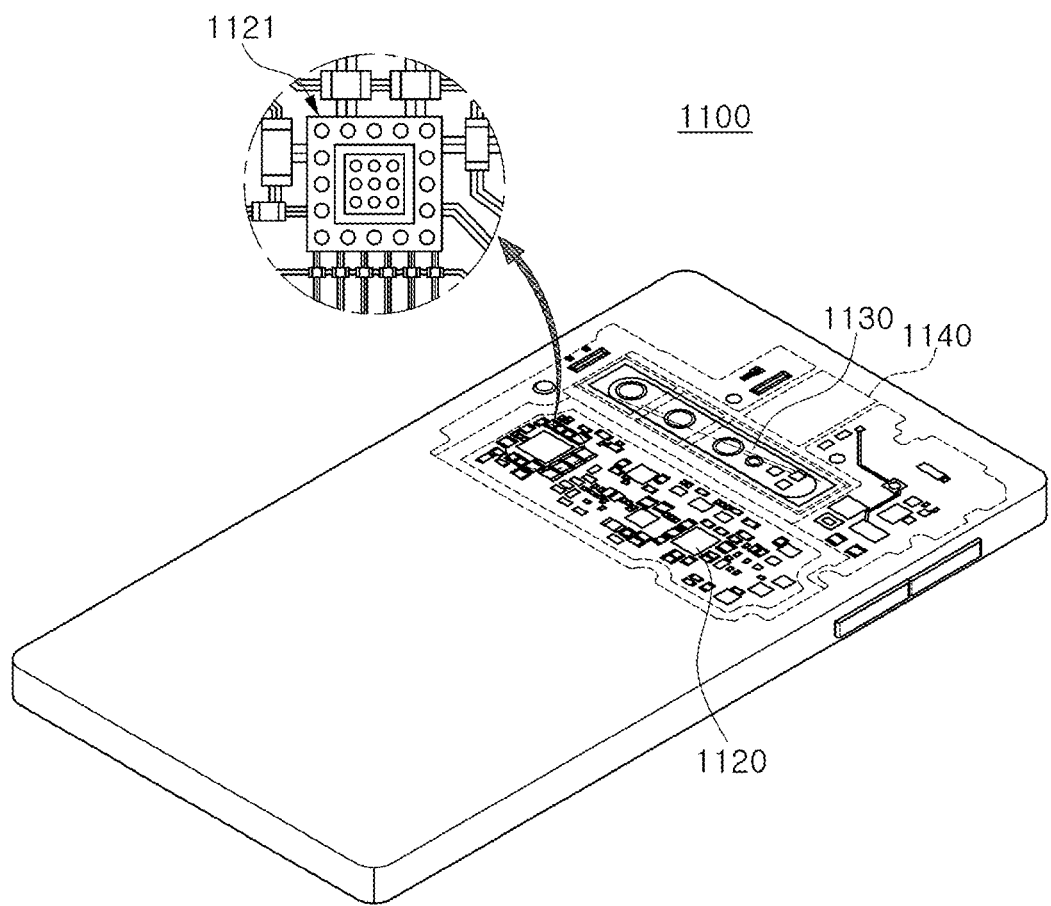
FIG. 2 is a perspective view schematically illustrating an example of an electronic device.

FIG. 2 is a perspective view schematically illustrating an example of an electronic device.

Referring to FIG. 2, an electronic device may be, for example, a smartphone 1100. A motherboard 1110 is accommodated inside the smartphone 1100, and various components 1120 are physically and/or electrically connected to the motherboard 1110. In addition, other components that may or may not be physically and/or electrically connected to the motherboard 1110 are accommodated therein, such as the camera module 1130 and/or the speaker 1140. A portion of the component 1120 may be the aforementioned chip-related component, for example, a component package 1121, but an embodiment thereof is not limited thereto. The component package 1121 may be in a form of a printed circuit board on which an electronic component including an active component and/or a passive component are surface-mounted. Alternatively, the component package 1121 may be in a form of a printed circuit board in which an active component and/or a passive component are embedded. Meanwhile, the electronic device is not necessarily limited to the smartphone 1100, and may be other electronic devices as described above.

Printed Circuit Board

Figure 3:
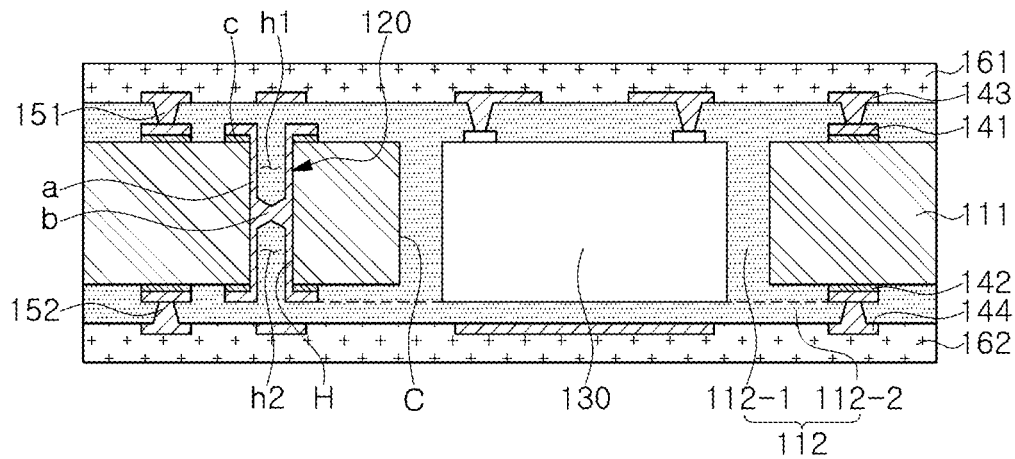
FIG. 3 is a cross-sectional view schematically illustrating an example of a printed circuit board.

FIG. 3 is a cross-sectional view schematically illustrating an example of a printed circuit board.

Referring to FIG. 3, a printed circuit board 100 according to an example includes: a first insulating layer 111, a through-hole H penetrating through the first insulating layer 111, a via conductor layer 120 disposed in the through-hole H and having first and second groove portions h1 and h2 recessed inwardly of the through-hole, from upper and lower surfaces of the first insulating layer 111, respectively, a cavity C penetrating through at least a portion of the first insulating layer 111, an electronic component 130 disposed in the cavity C, and a second insulating layer 112 filling at least a portion of each of the through-hole H and the cavity C while covering at least a portion of the first insulating layer 111.

If necessary, the printed circuit board 100 according to an example may further include: a first interconnection layer 141 disposed on an upper surface of the first insulating layer 111, a second interconnection layer 142 disposed on a lower surface of the first insulating layer 111, a third interconnection layer 143 disposed on an upper surface of the second insulating layer 112, a first via 151 penetrating through a portion of the second insulating layer 112 to electrically connect the first and third interconnection layers 141 and 143, a fourth interconnection layer 144 disposed on a lower surface of the second insulating layer 112, a second via 152 penetrating through the other portion of the second insulating layer 112 to electrically connect the second and fourth interconnection layers 142 and 144, a first resist layer 161 disposed on an upper surface of the second insulating layer 112 and covering at least a portion of the third interconnection layer 143, and/or a second resist layer 162 disposed on a lower surface of the second insulating layer 112 and covering at least a portion of the fourth interconnection layer 144.

As described above, in the printed circuit board 100 according to an example, filling of the through-hole H and embedding of the electronic component 130 may be performed by the same second insulating layer 112. Accordingly, a lead time for manufacturing a substrate may be shortened. In addition, in the printed circuit board 100 according to an example, the via conductor layer 120 may be bridged in a central portion of the through-hole H. For example, the via conductor layer 120 may include a first conductor layer (a) disposed on an inner wall of the through-hole H, and a second conductor layer (b) extending from the first conductor layer (a) to be disposed to block the central portion of the through-hole H. First and second groove portions h1 and h2 may be physically separated by the second conductor layer (b). The second insulating layer 112 may include a 2-1 insulating layer 112-1 disposed on an upper surface of the first insulating layer 111 and filling at least a portion of each of the first groove portion h1 of the through-hole H and the cavity C and a 2-2 insulating layer 112-2 disposed on a lower surface of the first insulating layer 111 and filling at least a portion of the second groove portion h2. Accordingly, the filling of the through-hole H by the second insulating layer 112 may be easier. In addition, since a plugging process can be eliminated, it may be possible to reduce substrate stress and improve plating thickness distribution. In addition, since a type of an insulating material is reduced due to the elimination of a plugging material, mismatching of the coefficient of thermal expansion between materials and the reliability risk may be reduced, and thus higher reliability may be secured.

Hereinafter, the components of the printed circuit board 100 according to an example will be described in more detail with reference to the drawings.

The insulating material may be an insulating resin such as a thermosetting resin such as an epoxy resin, or a thermoplastic resin such as polyimide, or a material in which these resins are mixed with an inorganic filler such as silica, or the like, or a resin impregnated with a core material such as glass fiber (Glass Fiber, Glass Cloth, Glass Fabric) together with the inorganic filler, for example, prepreg, copper clad laminate (CCL), or the like, but an embodiment thereof is not limited thereto.

The second insulating layer 112 may be a build-up insulating layer. The second insulating layer 112 may also include an insulating material. As the insulating material, an insulating resin such as a thermosetting resin such as an epoxy resin or a thermoplastic resin such as polyimide, or a material in which these resins are mixed with an inorganic filler such as silica, for example, ABF (Ajinomoto Build-up Film), or the like, may be used, but an embodiment thereof is not limited thereto. The second insulating layer 112 may be composed of a plurality of layers 112-1 and 112-2, which may be integrated without a boundary or separated from each other. The boundary therebetween them may be formed higher than that illustrated in the drawings. For example, the 2-2 insulating layer 112-2 may fill at least a portion of the cavity C.

The through-hole H may penetrate through between upper and lower surfaces of the first insulating layer 111. In a cross-section, the through-hole H may have substantially the same width from the upper surface of the first insulating layer 111 to the lower surface of the first insulating layer 111. At least a portion of each of the inorganic fillers and/or glass fibers included in the first insulating layer 111 may protrude from a wall surface of the through-hole H, but an embodiment thereof is not limited thereto.

The cavity C may be spaced apart from the through-hole H and may be a through-cavity penetrating through between the upper and lower surfaces of the first insulating layer 111. In a cross-section, the cavity C may have substantially the same width from the upper surface of the first insulating layer 111 to the lower surface of the first insulating layer 111, but an embodiment thereof is not limited thereto, and the cavity C may have a tapered shape in which a width of the upper surface is larger than a width of the lower surface. At least a portion of each of the inorganic fillers and/or glass fibers included in the first insulating layer 111 may protrude from the wall surface of the cavity C, but is not limited thereto.

The via conductor layer 120 may include a pulse plating layer. For example, the via conductor layer 120 may include a first conductor layer (a) disposed on a wall surface of the through-hole (H) and a second conductor layer (b) disposed in a central portion of the through-hole (H). In this case, the first and second conductor layers (a and b) may include a pulse plating layer. The first conductor layer (a) may further include an electroless plating layer, for example, a chemical copper plating layer. The first and second conductor layers (a and b) may be integrally connected to each other without boundaries. The first and second conductor layers (a and b) may include a metal material such as copper (Cu), aluminum (Al), silver (AG), tin (Sn), gold (Au), nickel (Ni), lead (Pb), titanium (Ti), or alloys thereof. Preferably, it may include copper (Cu), but is not limited thereto. A plurality of via conductor layers 120 may be formed on the first insulating layer 111, and the number thereof is not particularly limited.

The via conductor layer 120 may be disposed to extend to the upper and lower surfaces of the first insulating layer 111, and may be electrically connected to each of the first and second interconnection layers 141 and 142. For example, the via conductor layer 120 may further include a copper foil (c) disposed on the upper and lower surfaces of the first insulating layer 111, and the first conductor layer (a) may be disposed to extend onto the copper foil (c). In this case, portions (a and c) extending to the upper and lower surfaces of the first insulating layer 111 of the via conductor layer 120 may include a greater number of conductor layers, than that of the portions (a) disposed on an inner wall of the through-hole H.

The electronic component 130 may be an active component and/or a passive component. The active component may include a semiconductor chip. The passive component may be a chip-type passive component, for example, a chip-type capacitor, a chip-type inductor, or the like. There may be a plurality of electronic components 130, and the plurality of electronic components 130 may be embedded together in the cavity C or after forming a plurality of cavities C in the first insulating layer 111, may be embedded in each of the cavities (C).

The semiconductor chip may include an integrated circuit (IC) die in which hundreds to millions of elements are integrated in a single chip. In this case, the integrated circuit (IC) may be, for example, a processor chip such as a central processor (e.g., CPU), a graphic processor (e.g., GPU), a field programmable gate array (FPGA), a digital signal processor, an encryption processor, a microprocessor, a microcontroller, an application processor (AP), a logic chip such as an analog-digital converter, an application-specific IC (ASIC), or the like, but is not limited thereto, and a memory chip such as a volatile memory (e.g., DRAM), a non-volatile memory (e.g., ROM), a flash memory, a high bandwidth memory (HBM), or the like, or may be any other type such as power management IC (PMIC).

The semiconductor chip may be formed based on an active wafer, and in this case, silicon (Si), germanium (Ge), gallium arsenide (GaAs), or the like may be used as a base material forming the body. Various circuits may be formed in the body. A connection pad may be formed on the body, and the connection pad may include a conductive material such as aluminum (Al) or copper (Cu). The connection pad may be electrically connected to the first interconnection layer 141 through a via. The semiconductor chip may be a bare-die, but is not limited thereto, and may be a packaged-die.

The first to fourth interconnection layers 141, 142, 143, and 144 may include a metal material such as copper (Cu), aluminum (Al), silver (Ag), tin (Sn), gold (Au), nickel (Ni), lead (Pb), titanium (Ti), or alloys thereof. Each of the first to fourth interconnection layers 141, 142, 143, and 144 may include an electroless plating layer (or chemical copper) and an electrolytic plating layer (or electrolytic copper), but is not limited thereto. The first and second interconnection layers 141 and 142 may further include a copper foil (c). Each of the first to fourth interconnection layers 141, 142, 143, and 144 may perform various functions depending on the design of the corresponding layer. For example, it may include a ground pattern, a power pattern, a signal pattern, and the like. Here, the signal pattern may include various signals other than a ground pattern and a power pattern, for example, a data signal. Each of these patterns may include a line pattern, a plane pattern, and/or a pad pattern.

The first and second vias 151 and 152 may include a metal material such as copper (Cu), aluminum (Al), silver (Ag), tin (Sn), gold (Au), nickel (Ni), lead (Pb), and titanium (Ti), or an alloy thereof. Each of the first and second vias 151 and 152 may be formed together when forming the third and fourth interconnection layers 143 and 144, and thus, each of the first and second vias 151 and 152 may include an electroless plating layer (or chemical copper) and an electrolytic plating layer (or electrolytic copper), but is not limited thereto. The first and second vias 151 and 152 may be filled type vias in which a via-hole is filled with a metal material, but is not limited thereto, and may be a conformal type in which a metal material is disposed along a wall surface of the via-hole. The first and second vias 151 and 152 may have a tapered shape opposite to each other in a cross-section, respectively. Each of the first and second vias 151 and 152 may be formed in plural, and each of the first and second vias 151 and 152 may perform various functions depending on a design of a corresponding layer. For example, the first and second vias 151 and 152 may include a ground via, a power via, a signal via, and the like. Here, the signal via may include a via for transmitting various signals other than a ground via and a power via, for example, a data signal.

The first and second resist layers 161 and 162 may be respectively disposed on an outermost side of the printed circuit board 100 to protect internal components. Materials of the first and second resist layers 161 and 162 are not particularly limited. For example, an insulating material may be used. In this case, a solder resist may be used as the insulating material, but is not limited thereto. An opening for opening at least a portion of each of the third and fourth interconnection layers 143 and 144 may be formed in the first and second resist layers 161 and 162, if necessary.

Meanwhile, the printed circuit board 100 may be a multi-layered board than illustrated in the drawings. For example, a build-up insulating layer may be further disposed on upper and lower surfaces of the second insulating layer 112, respectively, and an interconnection layer and a via may be formed in each of the build-up insulating layers. The number of layers of the build-up insulating layer and the interconnection layers and vias formed thereon is not particularly limited. The above-described contents of the second insulating layer 112, the third and fourth interconnection layers 143 and 144, and the first and second vias 151 and 152 may be applied to the build-up insulating layer, the interconnection layer, and the via, respectively.

FIGS. 4 to 11 are process diagrams schematically illustrating an example of manufacturing the printed circuit board of FIG. 3.

Referring to the drawings, a manufacturing method of the printed circuit board 100 according to an example includes: an operation of forming a through-hole H in a first insulating layer 111; an operation of forming a via conductor layer 120 having first and second groove portions h1 and h2 recessed inwardly of the through-hole H from the upper surface and the lower surface of the first insulating layer 111, respectively, in the through-hole H; an operation of forming a cavity C in the first insulating layer 111; an operation of disposing an electronic component 130 in the cavity C; and an operation of stacking a second insulating layer 112 on the first insulating layer 111 and filling at least a portion of the through-hole H and the cavity C with the second insulating layer 112.

If necessary, the method of manufacturing the printed circuit board 100 according to an example may further include: an operation of forming first and second interconnection layers 141 and 142 on upper and lower surfaces of a first insulating layer 111, respectively; an operation of forming third and fourth interconnection layers 141 and 142 on upper and lower surfaces of a second insulating layer 112; an operation of forming a first via 151 electrically connecting the first and third interconnection layers 141 and 142 in the second insulating layer 112; an operation of forming a second via 152 electrically connecting the second and fourth interconnection layers 142 and 144 in the second insulating layer 112; an operation of forming a first resist layer 161 on the upper surface of the second insulating layer 112; and/or an operation of forming a second resist layer 162 on the lower surface of the second insulating layer 112.

Hereinafter, a method of manufacturing the printed circuit board 100 according to an example will be described in more detail with reference to the drawings.

Figure 4:
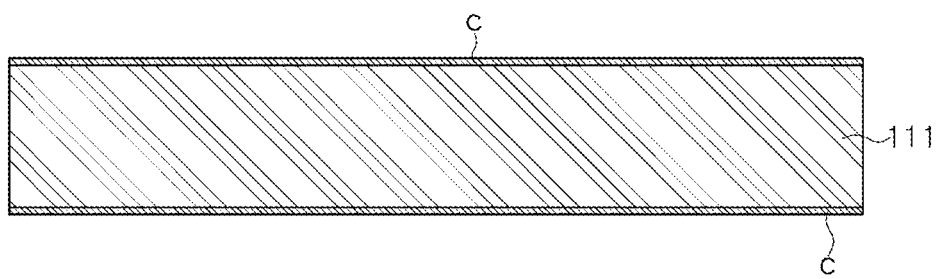
FIGS. 4 to 11 are process diagrams schematically illustrating an example of manufacturing the printed circuit board of FIG. 3.

Referring to FIG. 4, a first insulating layer 111 is prepared. The first insulating layer 111 may be a CCL as described above, and in this case, a copper foil (c) may be disposed on an upper surface and a lower surface thereof.

Figure 5:
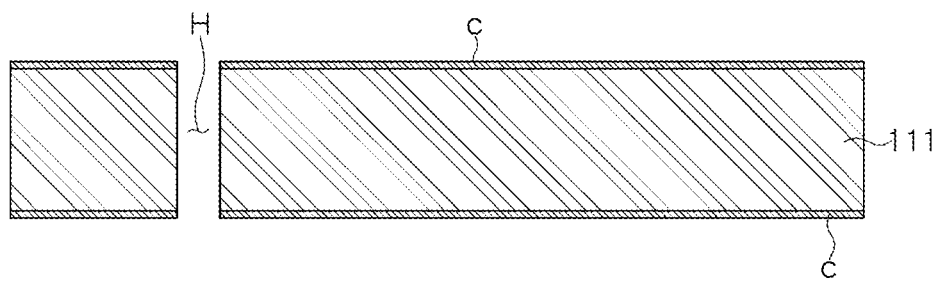

Referring to FIG. 5, a through-hole H is formed in the first insulating layer 111. The through-hole H may be formed using a laser drill, a mechanical drill, or the like. The through-hole H may be formed to penetrate through the first insulating layer 111.

Figure 6:
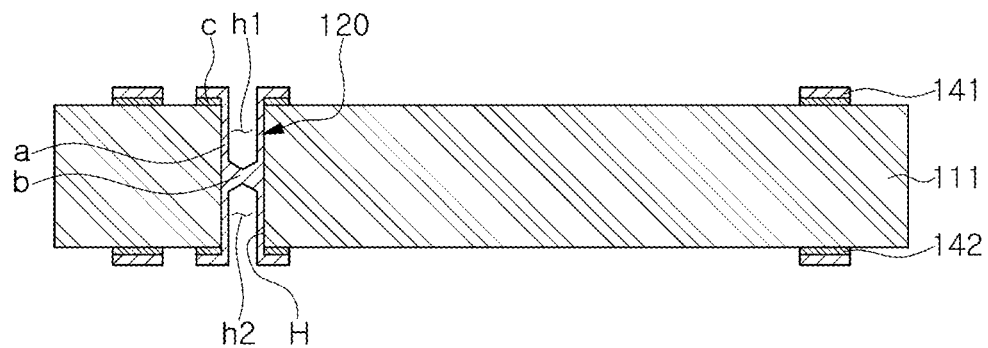

Referring to FIG. 6, a via conductor layer 120 is formed in the through-hole H by plating. For example, after forming chemical copper, pulse plating may be performed on the chemical copper to form first and second conductor layers (a) and (b) on an inner surface and a central portion of the through-hole H. In addition, first and second interconnection layers 141 and 142 are formed by plating on the upper and lower surfaces of the first insulating layer 111 by plating. The first conductor layer (a) may extend on the copper foil (c).

Figure 7:
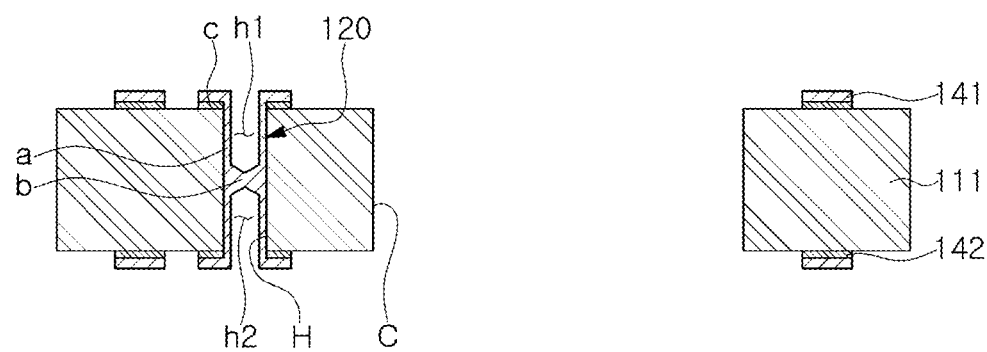

Referring to FIG. 7, a cavity C is formed in the first insulating layer 111. The cavity C may be formed using a laser drill, a mechanical drill, or the like. Alternatively, blast processing may be used. The cavity C may be formed to penetrate through the first insulating layer 111.

Figure 8:
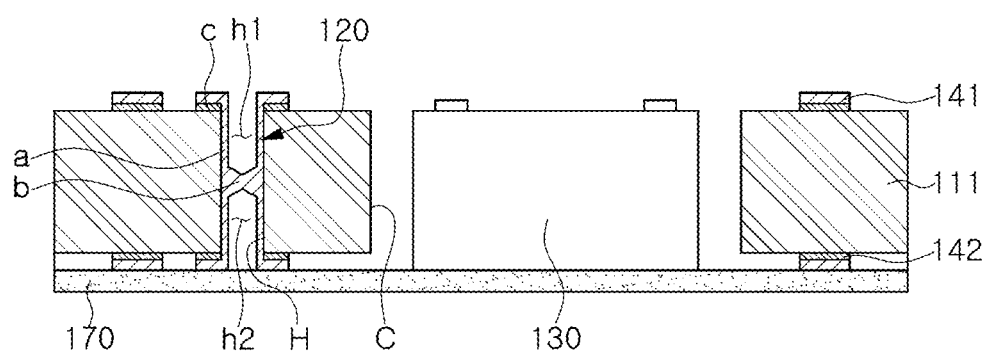

Referring to FIG. 8, a tape 170 is attached to a lower side of the first insulating layer 111. Thereafter, an electronic component 130 is attached to the tape 170 exposed through the cavity C. The tape 170 may be a known adhesive or adhesive tape.

Figure 9:
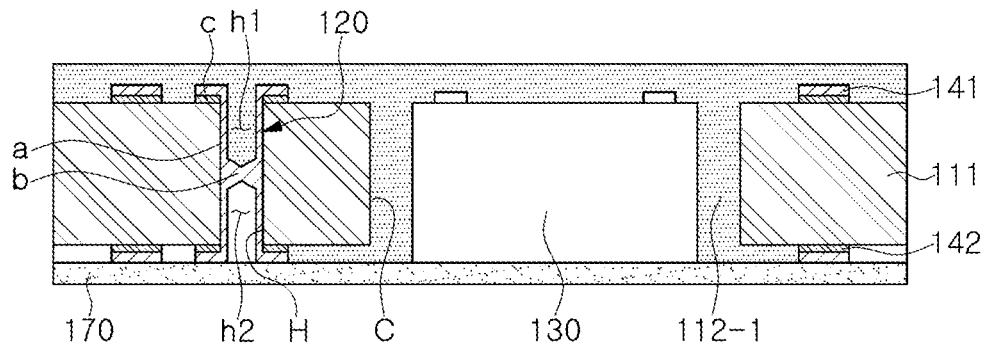

Referring to FIG. 9, a 2-1 insulating layer 112-1 is stacked on an upper side of the first insulating layer 111 to fill at least a portion of each of a first groove portion h1 and the cavity C. In this case, at least a portion of each of the first groove portion h1 of the through-hole H and the cavity C may be substantially simultaneously filled by the 2-1 insulating layer 112-1.

Figure 10:
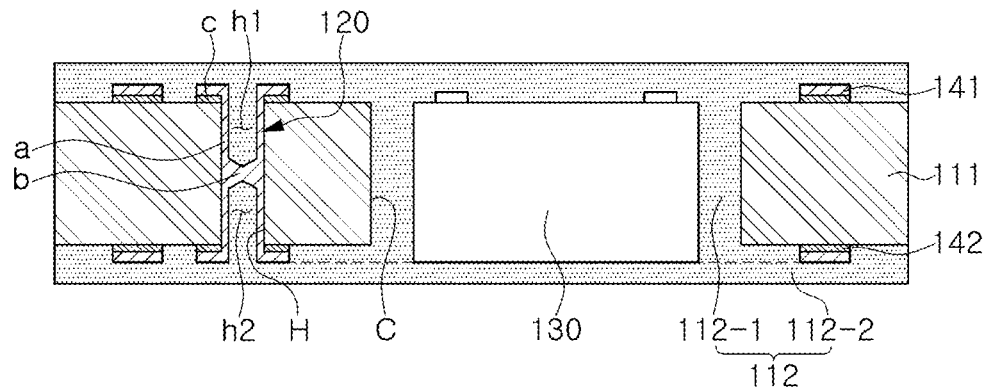

Referring to FIG. 10, the tape 170 is removed. Thereafter, a 2-2 insulating layer 112-2 is stacked on a lower side of the first insulating layer 111 to fill at least a portion of a second groove portion h2.

Figure 11:
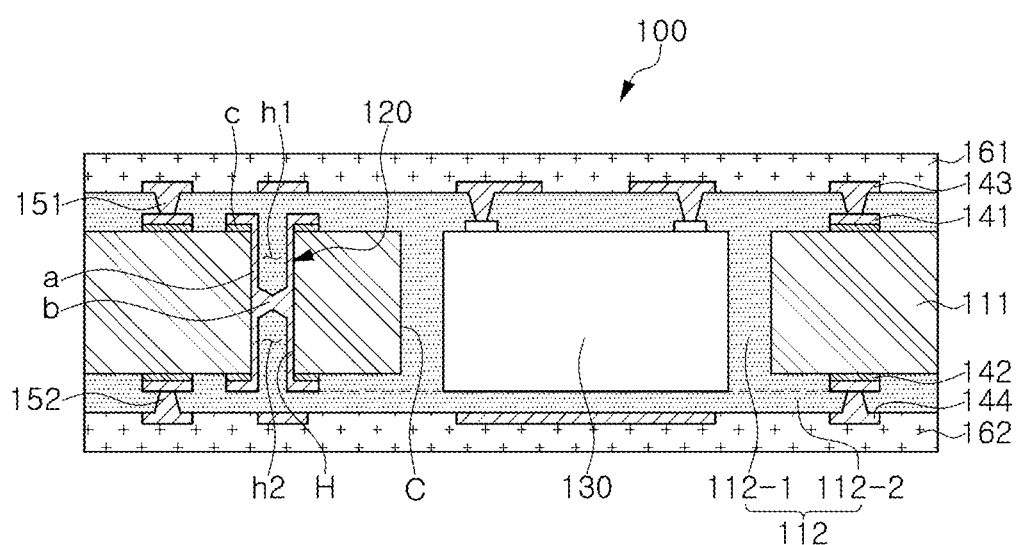

Referring to FIG. 11, after processing via-holes in upper and lower portions of the second insulating layer 112, third and fourth interconnection layers 143 and 144 and first and second vias 151 and 152 are formed by a plating process. In addition, first and second resist layers 161 and 162 are formed by applying a liquid solder resist or stacking a film-type solder resist on the upper and lower surfaces of the second insulating layer 112, respectively.

Through a series of processes, the printed circuit board 100 according to the above-described example may be manufactured. Other contents are substantially the same as those described for the printed circuit board 100 according to the above-described example, and the same can be applied to the method of manufacturing the printed circuit board 100 according to the example, so the overlapping contents thereof will be omitted.

In the present disclosure, the width may be measured using a scanning microscope or an optical microscope, for example, an optical microscope (×1000) manufactured by Olympus Co., based on the polished or cut cross-section of the printed circuit board.

For example, being substantially the same may include not only a case of being completely identical, but also a case of having a small difference approximately generated due to a process error. Also, being substantially simultaneously filled may include being substantially simultaneously filled by the same process.

In the present disclosure, the meaning of "in a cross-section" may mean a cross-sectional shape when an object is vertically cut, or a cross-sectional shape when the object is viewed from a side-view. In addition, the meaning on a plane may be a shape when the object is horizontally cut, or a planar shape when the object is viewed from a top-view or a bottom-view.

In the present disclosure, a horizontal direction may be any direction on a plane, and the vertical direction may be an upper or lower direction, perpendicular to the horizontal direction in the cross-section.

In the present disclosure, an upper surface, an upper side, a lower side, and a lower portion may be determined based on a first direction. For example, the upper surface may mean a top surface with respect to the first direction, and the lower surface may mean a bottom surface with respect to the first direction.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and does not necessarily refer to the same embodiment. Furthermore, the particular characteristics or features may be combined in any suitable manner in one or more embodiments. For example, a context described in a specific exemplary embodiment maybe used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposing the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As set forth above, as one effect of the various effects of the present disclosure, a printed circuit board capable of shortening a lead time for manufacturing a substrate and a method for manufacturing the same can be provided.

As another effect of the various effects of the present disclosure, a printed circuit board that can easily fill an inside of a through-hole even when a thickness of the core layer is thick, and a method for manufacturing the same may be provided.

While exemplary embodiments have been shown and described above, it will be apparent to those skilled in the art that modifications and variations could be made without departing from the scope of the present invention as defined by the appended claims.

What is claimed is:

1. A printed circuit board, comprising:
   a first insulating layer;
   a through-hole penetrating through the first insulating layer;
   a via conductor layer disposed in the through-hole, and having first and second groove portions recessed inwardly of the through-hole from an upper surface and a lower surface of the first insulating layer, respectively;
   a cavity penetrating through at least a portion of the first insulating layer;
   an electronic component disposed in the cavity; and
   a second insulating layer covering at least a portion of the first insulating layer, and disposed in at least a portion of each of the through-hole and the cavity.

2. The printed circuit board of claim 1, wherein the via conductor layer comprises:

a first conductor layer disposed on an inner wall of the through-hole; and a second conductor layer extending from the first conductor layer and disposed in the through-hole to physically separate the first and second groove portions.

3. The printed circuit board of claim 2, wherein the second conductor layer is disposed in a central portion of the through-hole.

4. The printed circuit board of claim 2, wherein the first and second conductor layers comprise a pulse plating layer.

5. The printed circuit board of claim 1, wherein the second insulating layer comprises,
a 2-1 insulating layer disposed on the upper surface of the first insulating layer, and disposed in at least a portion of each of the first groove portion and the cavity; and
a 2-2 insulating layer disposed on the lower surface of the first insulating layer, and disposed in at least a portion of the second groove portion.

6. The printed circuit board of claim 1, wherein the through-hole and the cavity are disposed to be spaced apart from each other, and penetrate through between the upper and lower surfaces of the first insulating layer, respectively.

7. The printed circuit board of claim 1, further comprising:
a first interconnection layer disposed on the upper surface of the first insulating layer; and
a second interconnection layer disposed on the lower surface of the first insulating layer,
wherein the via conductor layer extends to the upper and lower surfaces of the first insulating layer to be connected to each of the first and second interconnection layers.

8. The printed circuit board of claim 7, wherein a portion of the via conductor layer, extending to the upper surface and the lower surface of the first insulating layer, comprises a greater number of conductor layers than that of a portion disposed on an inner wall of the through-hole.

9. The printed circuit board of claim 7, further comprising:
a third interconnection layer disposed on an upper surface of the second insulating layer;
a first via penetrating through one portion of the second insulating layer, and connecting the first and third interconnection layers;
a fourth interconnection layer disposed on a lower surface of the second insulating layer; and
a second via penetrating through the other portion of the second insulating layer, and connecting the second and fourth interconnection layers.

10. The printed circuit board of claim 1, further comprising:
a first interconnection layer disposed on the upper surface of the first insulating layer;
a third interconnection layer disposed on an upper surface of the second insulating layer; and
a first via layer penetrating through one portion of the second insulating layer, and connecting the first and third interconnection layers and connecting the third interconnection layer and a pad of the electronic component.

11. The printed circuit board of claim 1, wherein the first insulating layer comprises Copper Clad Laminate (CCL), wherein the second insulating layer comprises Ajinomoto Build-up Film (ABF).

12. The printed circuit board of claim 1, wherein the via conductor layer comprises a conductor portion disposed in the through-hole to physically separate the first and second groove portions, and
wherein a thickness of the conductor portion along a central axis of the through-hole is lesser than a thickness of the first or second groove portion along the central axis.

13. A manufacturing method for a printed circuit board, comprising:
forming a through-hole in a first insulating layer;
forming a via conductor layer having first and second groove portions recessed inwardly of the through-hole from an upper surface and a lower surface of the first insulating layer, respectively, in the through-hole;
forming a cavity in the first insulating layer;
disposing an electronic component in the cavity; and
stacking a second insulating layer on the first insulating layer, and filling at least a portion of each of the through-hole and the cavity with the second insulating layer.

14. The manufacturing method for a printed circuit board of claim 13, wherein, when the second insulating layer is stacked on the first insulating layer, at least a portion of each of the through-hole and the cavity are substantially simultaneously filled with the second insulating layer.

15. The manufacturing method for a printed circuit board of claim 13, wherein the cavity is formed to penetrate through the first insulating layer.

16. The manufacturing method for a printed circuit board of claim 15, wherein the disposing the electronic component comprises:
attaching a tape to a lower side of the first insulating layer; and
attaching the electronic component on the tape exposed through the cavity.

17. The manufacturing method for a printed circuit board of claim 16, wherein the stacking the second insulating layer comprises:
stacking a 2-1 insulating layer on an upper side of the first insulating layer, and filling at least a portion of each of the first groove portion and the cavity;
removing the tape; and
stacking a 2-2 insulating layer on a lower side of the first insulating layer, and filling at least a portion of the second groove portion.

18. The manufacturing method for a printed circuit board of claim 13, wherein the forming of the via conductor layer comprises:
forming a first conductor layer on an inner wall of the through-hole; and
forming a second conductor layer extending from the first conductor layer in the through-hole to physically separate the first and second groove portions.

19. The manufacturing method for a printed circuit board of claim 18, wherein the second conductor layer is formed in a central portion of the through-hole.

20. The manufacturing method for a printed circuit board of claim 18, wherein the first and second conductor layers are formed by pulse plating.

21. The manufacturing method for a printed circuit board of claim 13, wherein the via conductor layer comprises a conductor portion disposed in the through-hole to physically separate the first and second groove portions, and wherein a thickness of the conductor portion along a central axis of the through-hole is lesser than a thickness of the first or second groove portion along the central axis.

* * * * *